(12) United States Patent
Toyoda et al.

(10) Patent No.: US 7,033,937 B2
(45) Date of Patent: Apr. 25, 2006

(54) APPARATUS AND METHOD FOR USE IN MANUFACTURING A SEMICONDUCTOR DEVICE

(75) Inventors: Kazuyuki Toyoda, Tokyo (JP); Osamu Kasahara, Tokyo (JP); Tsutomu Tanaka, Tokyo (JP); Mamoru Sueyoshi, Tokyo (JP); Nobuhito Shima, Tokyo (JP); Masanori Sakai, Tokyo (JP)

(73) Assignee: Hitachi Kokusai Electric, Inc., Tokyo (JP)

(*) Notice: Subject to any disclaimer, the term of this patent is extended or adjusted under 35 U.S.C. 154(b) by 88 days.

(21) Appl. No.: 10/342,011

(22) Filed: Jan. 14, 2003

(65) Prior Publication Data

US 2003/0124876 A1   Jul. 3, 2003

Related U.S. Application Data

(62) Division of application No. 09/768,663, filed on Jan. 24, 2001, now Pat. No. 6,576,063.

(30) Foreign Application Priority Data

Mar. 30, 2000 (JP) ............................. 2000-093139

(51) Int. Cl.
*H01L 21/44* (2006.01)
*H01L 21/31* (2006.01)

(52) U.S. Cl. ............... 438/680; 438/685; 438/758; 438/785

(58) Field of Classification Search ........... 438/758, 438/785, 680, 681, 685; 427/585, 248.1
See application file for complete search history.

(56) References Cited

U.S. PATENT DOCUMENTS

| 5,389,197 A * | 2/1995 | Ishimaru ................ 216/67 |
| 6,187,693 B1 * | 2/2001 | Koyanagi ............... 438/785 |
| 6,261,973 B1 * | 7/2001 | Misium et al. ......... 438/775 |

* cited by examiner

*Primary Examiner*—Alexander Ghyka
(74) *Attorney, Agent, or Firm*—Katten Muchin Rosenman LLP

(57) ABSTRACT

An apparatus for use in manufacturing a semiconductor device allows one or more substrates treated substantially free of the metal particles released from the chamber wall and the high energy particles emitted from the plasma and also allows them to uniformly heated to a relatively high temperature. The apparatus comprises a reaction chamber wherein one or more substrates to be treated are disposed, a plasma source arranged outside of and in proximity to the reaction chamber, an active species supply port for providing active species generated by the plasma source to the reaction chamber and arranged at a side of the reaction chamber and an exhaust port provided at the opposite side to the active species supply port. The active species flows parallel to the surfaces of the substrates.

18 Claims, 18 Drawing Sheets

APPARATUS AND METHOD FOR USE IN MANUFACTURING A SEMICONDUCTOR DEVICE

This is a division of application Ser. No. 09/768,663, filed Jan. 24, 2001, now U.S. Pat. No. 6,576,063.

FIELD OF THE INVENTION

The present invention relates to an apparatus and method for use in manufacturing a semiconductor device; and, more particularly, to an apparatus and method for use in forming films on surfaces of one or more substrates such as semiconductor substrate and glass substrate and improving the film quality.

DESCRIPTION OF THE PRIOR ART

In the semiconductor industry, various kinds of films are manufactured by thermal chemical vapor deposition (CVD) method. Some of them are acceptable without further treatment but others may need pre-deposition treatment and/or post-deposition treatment in order to achieve a desired performance.

An example of the latter case requiring a further treatment is tantalum pentoxide ($Ta_2O_5$) film which is used as a capacitor insulating film for semiconductor memory and the like. In a process for forming a tantalum oxide film as an insulating film for a capacitor portion of a 64 megabit-DRAM, volatized tantalum pentaethoxide ($Ta(OC_2H_5)_5$) gas as a precursor and oxygen gas are delivered into a reaction chamber maintaining a predetermined temperature and reacted with a Si wafer, to thereby form an oxide film.

During the deposition process of the tantalum oxide film, carbon included in the precursor, i.e., tantalum pentaethoxide ($Ta(OC_2H_5)_5$) may be introduced into tantalum pentoxide film and, when the amount of the carbon in the film exceeds a certain level, the insulating characteristics of the film become deteriorated, thereby elevating the leakage current.

By treating the wafer in a gaseous atmosphere including oxygen as a component thereof, carbon is removed from the film in the form of carbon dioxide and the concentration of the carbon in the film becomes decreased, thereby lowering the leakage current. Further, oxygen, which is generally insufficiently incorporated into the growing film during the deposition process, may also be supplied to the film.

One of the techniques for post-processing a tantalum oxide film is a furnace annealing method. In this method, thermal treatment is performed on a deposited tantalum pentoxide ($Ta_2O_5$) film at a temperature of higher than 800° C. in an atmosphere of a gas including oxygen as a component thereof, e.g., $O_2$, $O_3$ (ozone), $N_2O$ or NO. Conventionally, the deposition process is performed at a temperature equal to or lower than 500° C., which is considerably different from post-processing temperature, and, therefore, the post-deposition treatment is normally performed in a separate chamber or a separate apparatus.

In an alternative post-deposition treatment, the wafer is treated by active species generated from the plasma of gases including oxygen as a component thereof, e.g., $O_2$, $O_3$, $N_2O$ or NO.

Without such post-deposition treatments, the leakage current level may be so high that the tantalum pentoxide film cannot function properly as a capacitor insulating film.

FIG. 1 shows compositional depth profiles of the elements included in the tantalum oxide film manufactured by the above mentioned deposition process at a temperature of 470° C. The abscissa of this graph represents the depth from the surface of tantalum oxide film and the ordinate at the left provides the atom concentrations (atoms/cc) of C, H and N, and the ordinate at the right shows the secondary ion counts (counts/sec) of Ta and Si. The thickness of the tantalum oxide film is 100 Å.

As shown in FIG. 1, a very small amount of carbon is included at the interface between the Si wafer and the tantalum oxide film but this amount of carbon can be sufficient enough to deteriorate the film quality, i.e., entail a leakage current. In order to remove carbon from the interface to thereby reduce the amount of leakage, therefore, the substrate is processed by oxygen after the film forming. Specifically, oxygen annealing is performed at a temperature of higher than 800° C. after the film forming.

FIG. 2 provides compositional depth profiles of a tantalum oxide film formed at 450° C. and oxygen-annealed at 600° C. in a reduced pressure. The abscissa of this graph shows the depth from the surface of the substrate and the ordinate at the left shows the atom concentrations (atoms/cc) of C, H and N, and the ordinate at the right shows the secondary ion counts (counts/sec) of Ta and Si. The thickness of the tantalum oxide film is 100 Å.

It is apparent from FIG. 2 that the concentration of hydrogen is decreased but carbon still remains at the interface.

Meanwhile, in order to meet the requirement of low temperature process, it is preferable to perform the oxygen annealing by using plasma. The temperature of wafer can be lowered to 300–400° C. during the process of using plasma. As an apparatus for plasma treatment, the so-called down-flow type apparatus appeared recently, in which the reactive gas flows downward from an upper region of the reaction chamber. This type of apparatus is preferable for achieving uniformity of film quality.

FIG. 3 shows a cross-sectional view of a down-flow type apparatus.

The apparatus includes an airtight reaction chamber 151 having walls 152 made of, e.g., stainless steel and a plasma chamber 154, arranged above the reaction chamber for generating plasma 153. The plasma chamber 154 has a quartz window 155 at its side and a coil 156 is arranged at the outer side of the quartz window 155. The coil 156 generates induced magnetic fields in the plasma chamber 154. A reactive gas inlet 157 is provided on top of the plasma chamber 154. In the reaction chamber 151, a substrate such as a wafer 158 is loaded on a wafer holder 159 having a built-in heater 160 for heating the wafer 158.

The apparatus is operated as follows.

The reaction chamber 151 and plasma chamber 154 are evacuated by an exhaust pump (not shown) through an exhaust port 161 and then a reactive gas of a predetermined flow rate is introduced through the reactive gas inlet 157 into the chambers 151, 154. After the inner pressure of the chambers 151, 154 becomes stabilized at a certain level, high frequency power is applied to the coil 156 from a high frequency power supply (not shown) in order to generate plasma 153 in the plasma chamber 154 and the substrate is processed by the plasma.

The plasma 153 generated in the plasma chamber 154 is spaced apart from the wafer 158 and only the neutral active species are provided to the wafer surface in the form of a down-flow 162.

Oxygen is generally used as the reactive gas. In the apparatus shown in FIG. 3, oxygen radicals (O*) activated by the plasma 153 is provided in the form of a down-flow 162 to the wafer surface to react with carbon and thereby remove carbon from the surface region of the wafer 158.

In this oxygen plasma treatment, the amount and the lifetime of the oxygen radicals may vary with the chamber pressure. Therefore, the flow rate of oxygen gas and the pressure of the plasma chamber 154 are controlled by, e.g., an exhaust pump. Typically, the process is performed under a chamber pressure of 1–100 Pa.

Such conventional type apparatus shown in FIG. 3 may have such deficiencies as: a) release of metal particles from the walls 152 of the reaction chamber 151 which is made of metal such as stainless steel; and b) high energy particles provided by the plasma 153.

The released metal contaminants may be incorporated into the wafer 158 or the film thereon to thereby reduce the yield.

The high energy particles from the plasma 153 may cause the metal contaminants released from the walls 152 of the reaction chamber 151 and also directly create physical and electrical defects in the wafer 158.

The apparatus shown in FIG. 3 is of a cold-wall type, in which only the wafer holder 159 is heated to a desired temperature.

This may entail other problems. Since the heat transfer to the wafer 158 may not be performed uniformly due to the bending and/or surface roughness of the wafer 158, it is difficult to heat the wafer 158 uniformly in a temperature range of 500° C.±1%. In order to solve this problem, electrostatic chuck has been contemplated. However, the use of a heater incorporated with an electrostatic chuck is not reliable in its wafer holding function and too costly to be used as a supply item.

Further, not all carbon contaminants in a relatively thick oxide film may be removed by a single post-deposition treatment: that is, post-deposition treatment may be effective only at a proximate portion of the film surface and may not affect the deeper portion of the film. As the semiconductor devices become more micro-structured and integrated, higher film quality, e.g., lower leakage level for tantalum pentoxide film, is required. This requirement may be fulfilled by repeating the deposition and post-deposition processes a multiple number of times, wherein the effect of post-deposition treatment may be uniformly achieved through the entire depth of film.

In the conventional type apparatus, a deposition process and a post-deposition process are performed in two separate chambers. Therefore, if these two processes are repeatedly performed in separate chambers, productivity becomes lowered due to, e.g., by the increased time for conveying the wafer between the chambers.

SUMMARY OF THE INVENTION

It is, therefore, an object of the present invention to provide an apparatus and a method for use in manufacturing a semiconductor device wherein a substrate to be processed is substantially not affected by the metal contaminants released from the chamber walls or the high energy particles emitted from the plasma and wherein the substrate can be uniformly heated to a relatively high temperature.

It is another object of the present invention to provide an apparatus and a method for use in manufacturing a semiconductor device capable of performing a deposition process and a pre- and/or a post-deposition process in an efficient manner.

In accordance with one aspect of the present invention, there is provided an apparatus for use in manufacturing a semiconductor device, comprising: a reaction chamber wherein one or more substrates to be treated are disposed; a plasma source arranged outside of and in proximity to the reaction chamber; an active species supply port for providing active species generated by the plasma source to the reaction chamber and arranged at a side of the reaction chamber; and, an exhaust port provided at the opposite side to the active species supply port, wherein the active species flows parallel to the surfaces of the substrates.

By arranging the plasma source outside of and in proximity of the reaction chamber, the substrates can be treated without metal contamination and damages by the plasma. Further, more than one substrate can be treated by supplying the active species flowing parallel to the substrates, thereby enhancing the throughput.

In accordance with a preferred embodiment of the invention, there is provided an apparatus for use in manufacturing a semiconductor device, comprising: means for supplying a film forming gas into a reaction chamber; and, a plasma source for generating active species supplied to one or more substrates to be treated.

By this constitution, the film forming process and the plasma treatment process can be performed in a same chamber.

As another aspect of the present invention, there is provided a method for use in manufacturing a semiconductor device by performing a predetermined treatment to one or more substrates, comprising the steps of: generating active species in a plasma source arranged outside of a reaction chamber; and, supplying active species flowing in a direction substantially parallel to the substrates.

In accordance with a preferred embodiment of the present invention, there is provided a method for use in manufacturing a semiconductor device, comprising the steps of: film forming on one or more substrates by thermal CVD method; and, plasma treating on the substrates.

BRIEF DESCRIPTION OF THE DRAWINGS

The above and other objects and features of the present invention will become apparent from the following description given in conjunction with the accompanying drawings, wherein.

DETAILED DESCRIPTION OF THE PREFERRED EMBODIMENTS

The preferred embodiments of the present invention will now be described in detail with reference to the accompanying drawings.

Figure 1:
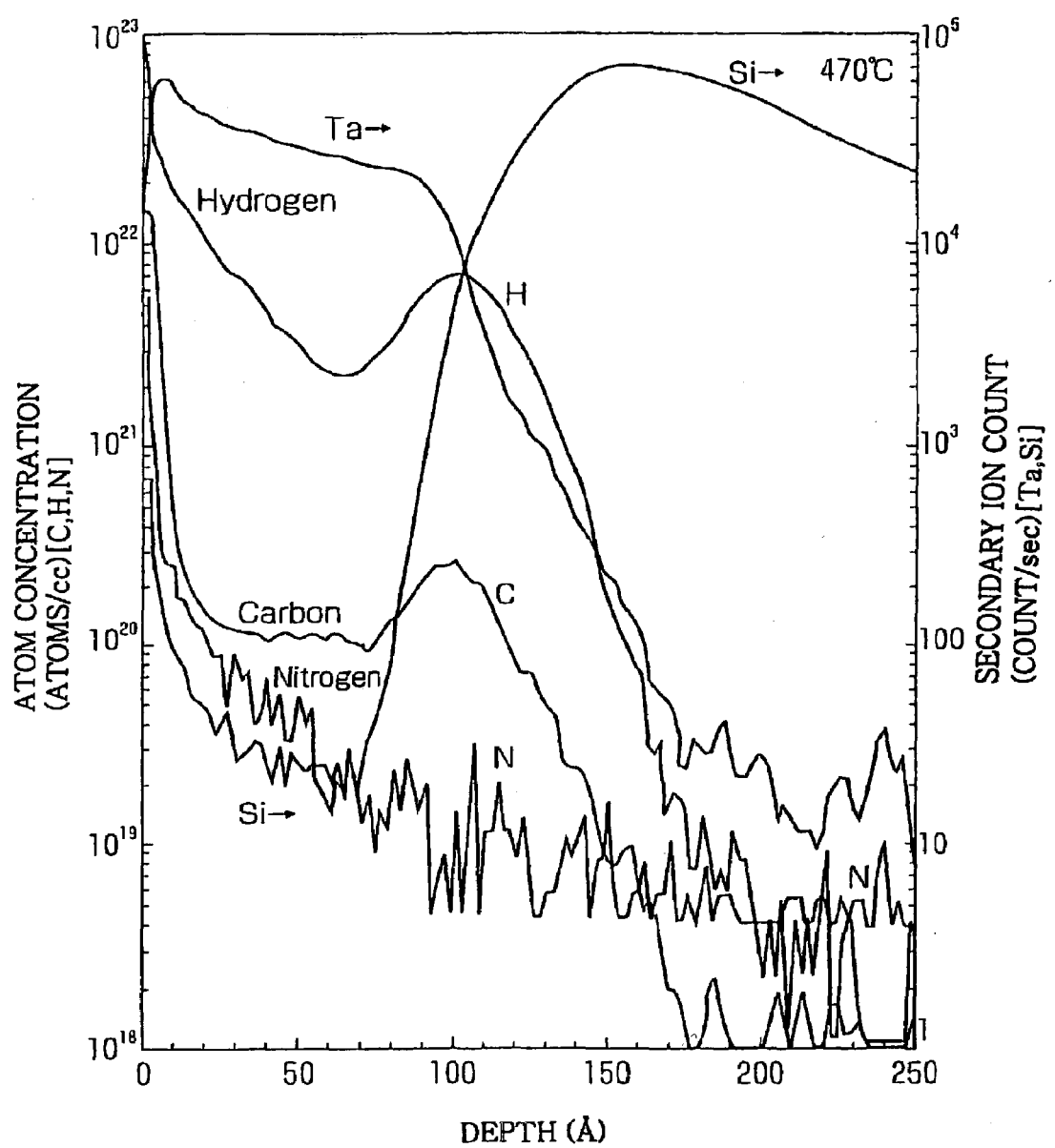
FIG. 1 reproduces compositional depth profiles of the elements included in a tantalum pentoxide film before post-treatment.
Figure 2:
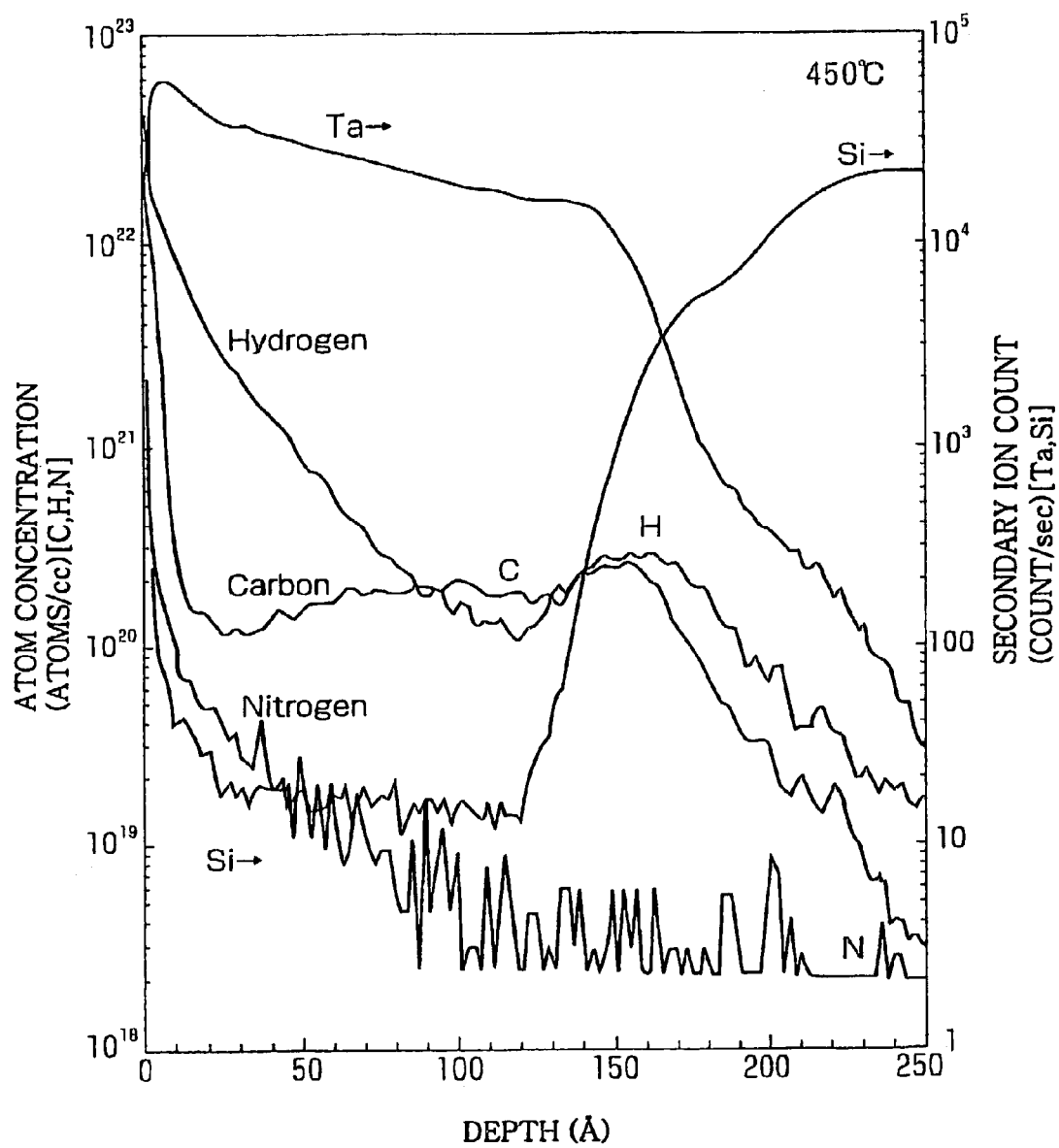
FIG. 2 charts compositional depth profiles of the elements included in a tantalum pentoxide film treated by a conventional oxygen annealing method.
Figure 3:
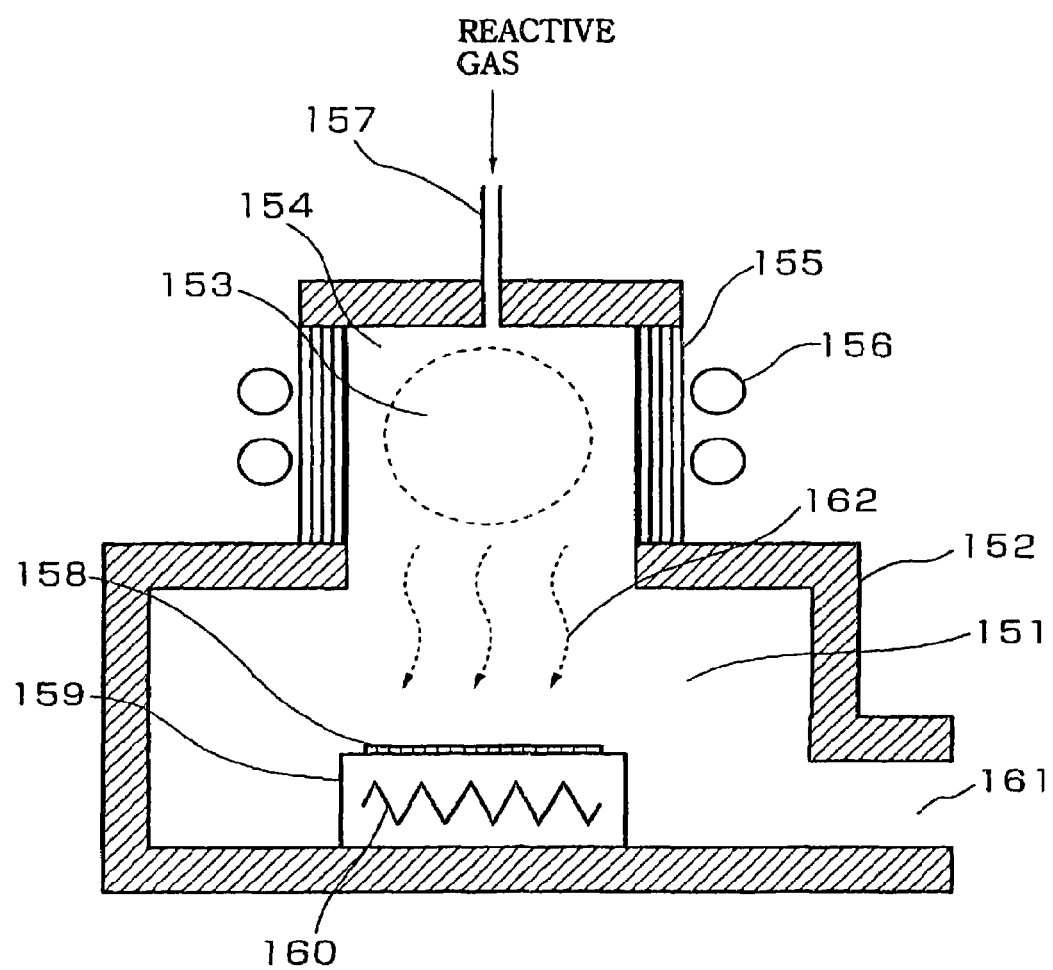
FIG. 3 pictorializes a cross-sectional view of a reaction chamber and a plasma chamber of a conventional reactor.
Figure 4A:
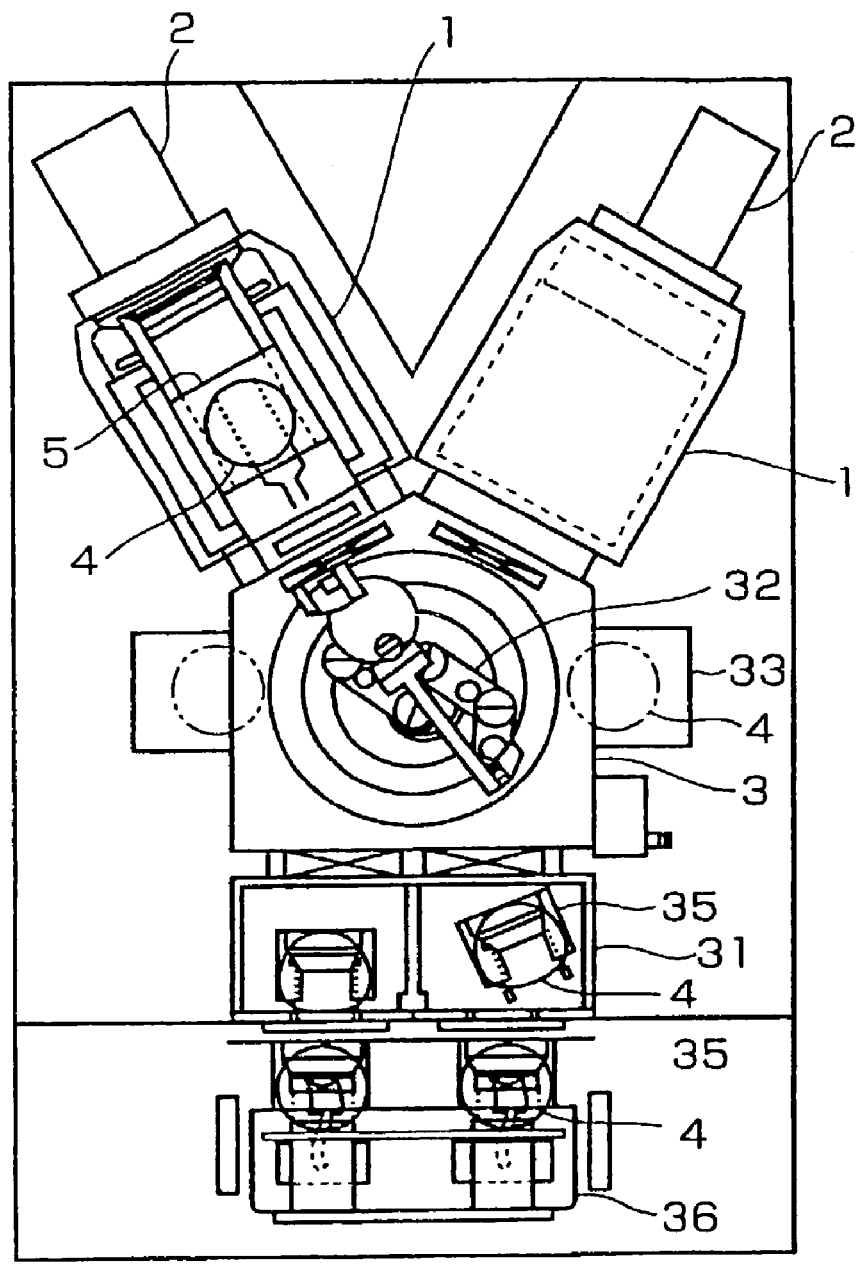
FIGS. 4A and 4B illustrate a plan view and a side view of the apparatus in accordance with the first embodiment of the present invention.
Figure 4B:
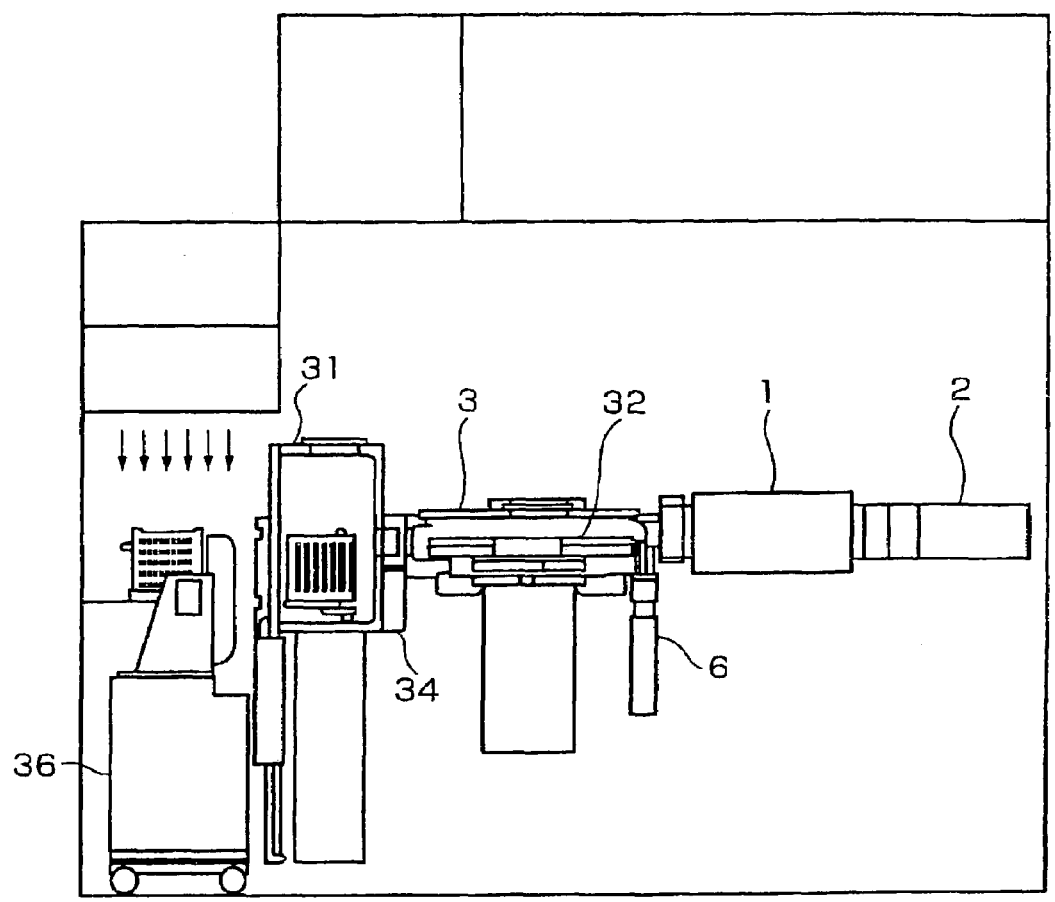

FIGS. 4A and 4B illustrate a plan view and a side view of a semiconductor manufacturing apparatus in accordance with a first embodiment of the present invention, respectively.

In the drawings, the reference numeral 4 represents wafers; 35, wafer cassettes for receiving the wafers 4; 31, load-lock chambers where the wafer cassettes 35 are conveyed into and then evacuated; 36, an auto cassette loader conveying the wafer cassette 35 into the load-lock chambers 31; 2, an ICP (inductively coupled plasma) type plasma source for generating plasma by exciting a supplied gas to thereby provide active species; 1, reaction chambers performing various treatments on the wafers using the actuated gases supplied from the plasma sources 2; 5, wafer holders, two wafer holders being arranged in a reaction chamber in order to process two wafers simultaneously; 3, an transfer chamber for conveying wafers between the load-lock chambers 31 and the reaction chambers 1 under vacuum; 32, a robot arranged in the transfer chamber 3; 33, cooling chambers for cooling heated wafers after the processes in the reaction chambers; 34, gate valves arranged between the load-lock chambers 31 and the transfer chamber 3; and 6, gate valves arranged between the transfer chamber 3 and the reaction chambers 1.

Figure 5:
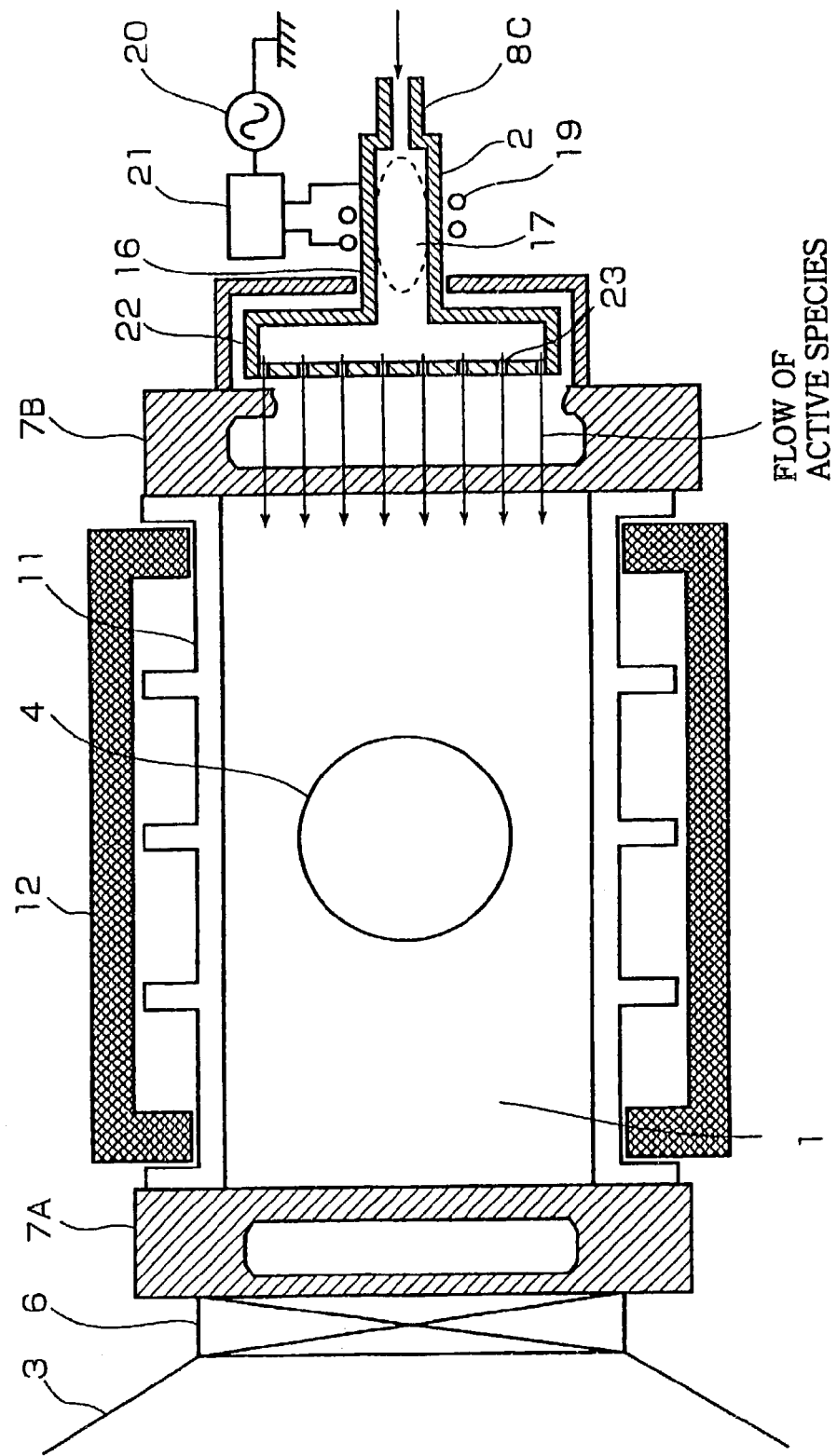
FIG. 5 is a cross-sectional plan view of a reaction chamber and a plasma source of an apparatus in accordance with a first embodiment of the present invention.
Figure 6:
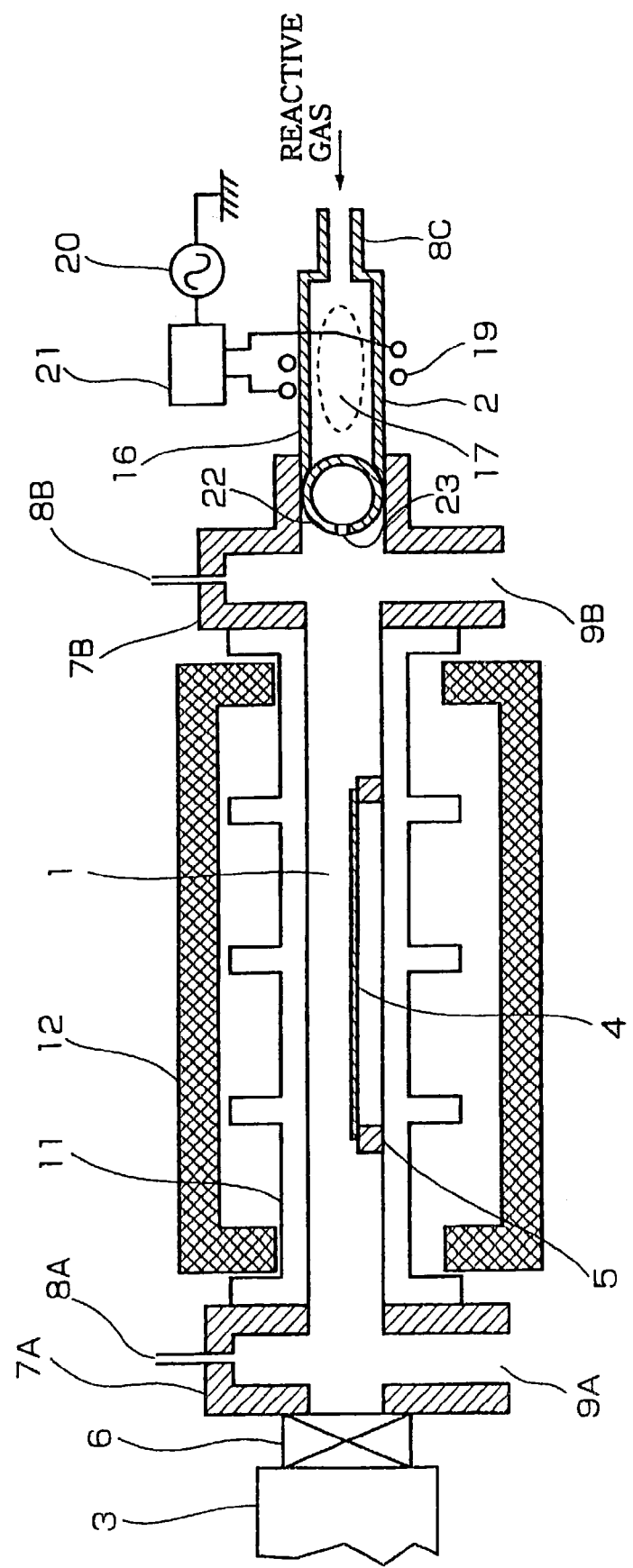
FIG. 6 shows a cross-sectional side view of the reaction chamber and the plasma source of the apparatus shown in FIG. 5.

FIGS. 5 and 6 represent a cross-sectional plan view and a cross-sectional side view of one of the reaction chambers 1, respectively, and one of the plasma sources 2 of the semiconductor manufacturing apparatus shown in FIGS. 4A and 4B.

As shown in FIGS. 5 and 6, the reaction chamber 1 includes a reaction tube 11 made of, e.g., quartz and a wafer holder 5 arranged therein and made of, e.g., quartz. The wafer 4 is conveyed by the robot 32 arranged in the transfer chamber 3 and is loaded onto the wafer holder 5. The reaction tube 11 of a hot-wall type is heated to and maintained at a predetermined temperature by a resistive electric heater 12 positioned therearound.

The wafer 4 is conveyed between the reaction chamber 1 and the transfer chamber 3 through the gate valve 6. The wafer 4 and other parts of the reaction chamber 1 are heated by the heater 12 installed outside of the reaction chamber 1. At the opposite side of the gas manifold 7B connected to the reaction tube 11 is arranged a discharge tube 16, wherein plasma 17 is generated.

The plasma source 2 utilizes inductively coupled plasma to excite the gas to thereby generate plasma having high efficiency. A power source having a radio frequency of, e.g., 13.56 MHz is used for generating the plasma.

Gas manifolds 7A, 7B are airtightly connected to two opposite end portions of the reaction tube 11, respectively. The gas manifolds 7A, 7B are respectively provided with reactive gas inlets 8A, 8B, through which the reactive gas is supplied to the reaction chamber 1. Further provided to the respective gas manifolds 7A, 7B are exhaust ports 9A, 9B at the bottom portions thereof, through which the reactive gas is exhausted from the reaction chamber 1.

The reactive gas is fed through a reactive gas inlet 8C installed at one end of the discharge tube 16, and the reactive gas itself or active species thereof is supplied into the reaction chamber 1 therethrough.

Although the material for the discharge tube 16 may be chosen depending on the types of the plasma 17 and the process, quartz is preferred because states of discharge in the discharge tube 16 can be easily observed therethrough. However, a ceramic having a low dielectric loss for the high frequency power may also be used.

A coil 19 formed of copper pipe is wound around the discharge tube 16 and a high frequency power generated by a RF generator 20 is applied thereto through an impedance matcher 21.

Since the temperature of the coil 19 is increased by a high frequency current flowing therethrough, it is preferable that the coil 19 be made of copper which has a low electric resistance, in a shape of pipe through which cooling water can flow. Further, the coil 19 is preferably arranged spaced apart from the discharge tube 16; and, more preferably, the surfaces of the coil are nickel-plated in order to prevent copper contamination of the discharge tube 16.

As shown in FIGS. 5 and 6, the discharge tube 16 in accordance with the first embodiment of the invention is of a T-shape having an active species supply port 22 facing the reaction tube 11, the supply port being extended in a direction substantially parallel to the main surface of the wafer 4. Further, the supply port 22 is provided with an active species supply outlet 23 formed toward the reaction chamber 1 along the direction of extension of the supply port 22, thereby enabling the active species to be uniformly supplied to the surface of the wafer 4.

The frequency of the high frequency power generated by the RF generator 20 is preferably 13.56 MHz. However, any frequency ranging from 400 kHz to 1 MHz or a microwave frequency of 2.45 GHz can also be used instead (see FIG. 12). The optimal frequency may be selected depending on the type of reactive gas or process pressure.

When the active species are generated by exciting the reactive gas into plasma, the type of generated active species depends on the electron temperature of the plasma. Therefore, by applying a pulsed high frequency power to the coil 19 and adjusting the duty ratio thereof, the electron temperature can be controlled and thus the ratio of the generated active species can be adjusted in a desired manner.

Further, since the lifetimes of the active species are different depending on their types, it is preferable that the distance between the plasma 17 (plasma source 2) and the wafer 4 be adjustable as required. In this embodiment, the coil 19 is constructed to be movable and, therefore, the distance therebetween can be adjusted by positioning the coil 19 at a proper location.

Figure 7:
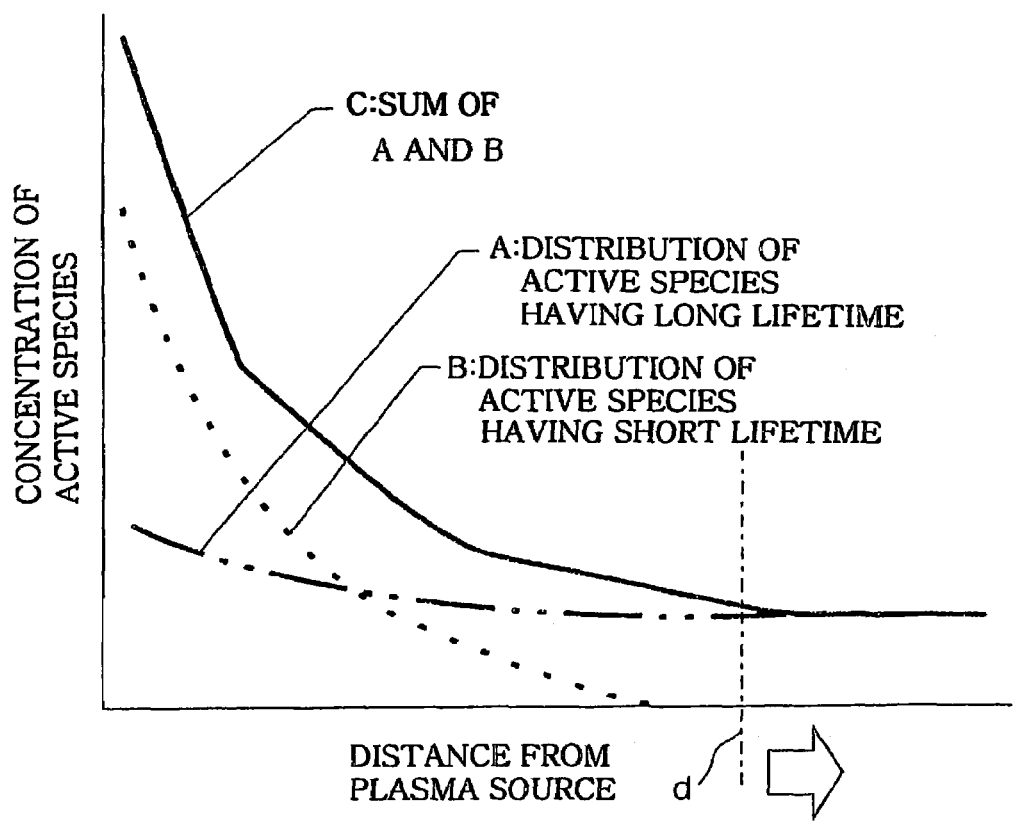
FIG. 7 exhibits a graph showing the concentrations of active species as a function of distance from the plasma source.

FIG. 7 is a graph showing the relation between the distance from the plasma source and the concentrations of active species. The abscissa of this graph shows the distance from the plasma source and the ordinate shows the concentrations of the active species.

Curve A represents a distribution of active species having longer lifetimes and curve B represents a distribution of active species having shorter lifetimes. Curve C is the superposition of Curve A and B.

As shown in FIG. 7, the total concentration of active species is decreased as the distance from the plasma source is increased and becomes constant when the distance exceeds a certain limit d. So, if the wafer 4 is placed in a region beyond the distance d, the active species of a constant concentration can be provided to the surface of the wafer 4, and, consequently, the treatment of the wafer 4 can be performed uniformly.

Further, since the reaction chamber 1 is of a hot wall type, the wafer 4 is prevented from metal contamination and can be treated at high temperatures since it can be uniformly heated even at a temperature higher than, e.g., 500° C.

As shown in FIG. 5, the active species supply port 22 having the supply outlet 23 is formed to extend in a direction parallel to the wafer 4 and the supply outlet 23 is constituted by a plurality of openings. This makes a uniform supply of the active species to the wafer 4 possible, and, therefore, the treatment for the wafer 4 can be performed uniformly.

Further, since the reactive gas inlets 8A, 8B and the plasma source 2 are provided in the reaction chamber 1 separately, as shown in FIG. 6, the deposition process can be performed on the wafer 4 by supplying the reactive gas to the reaction chamber 1 through the reactive gas inlets 8A, 8B; and, thereafter, the plasma treatment can be performed on the deposited film in the same chamber.

The operation of the semiconductor manufacturing apparatus in accordance with the first embodiment of the invention will now be described hereinafter with reference to FIGS. 4A to 6.

First, the wafer cassette 35 containing a number of wafers to be treated is loaded into the load-lock chamber 31 via the auto cassette loader 36. Thereafter, the load-lock chamber 31 is evacuated to vacuum. Next, the reaction chamber 1 is exhausted by an exhaust pump (not shown) through the exhaust ports 9A, 9B. Then, the gate valve 6 is opened and one of the wafers received in the wafer cassette 35 is transferred from the wafer cassette 35 in the load-lock chamber 31 onto the wafer holder 5 arranged in the reaction chamber 1 by the robot 32.

Thereafter, a reactive gas of a predetermined flow rate is supplied through the reactive gas inlet 8C arranged at an end portion of the discharge tube 16. The pressure of the reaction chamber 1 is controlled to have a predetermined level by a pressure regulator coupled thereto through the exhaust port 9A.

After the pressure in the reaction chamber 1 is stabilized, high frequency power generated by the RF generator 20 is applied via the matcher 21 to the coil 19 wound around the discharge tube 16. By the alternating electromagnetic field generated by the coil 19, the gas in the discharge tube 16 is plasma discharged to generate the plasma. Active species excited by the plasma are supplied into the reaction chamber 1 through the active species supply outlet 23 to process the wafer 4.

With reference to FIGS. 5 and 6, there will be described a post-deposition process, i.e., carbon removing treatment by using oxygen, of a tantalum pentoxide film used as a dielectric layer of a DRAM capacitor.

After introducing the wafer 4 having tantalum pentoxide film deposited thereon into the reaction chamber 1, oxygen gas is supplied to the reaction chamber 1 with a flow rate of about 300–400 sccm through the reactive gas inlet 8C at the end portion of the discharge tube 16 (other reactive gas inlets 8A, 8B are not used). After the pressure in the reaction chamber 1 is stabilized, high frequency power is supplied to the coil 19 surrounding the discharge tube 16, inducing plasma discharge in the discharge tube 16 to generate plasma 17. Oxygen radicals activated by the plasma 17 are supplied into the reaction chamber 1 through the supply outlet 23 and then onto the tantalum pentoxide film formed on the wafer 4. The carbon removing treatment is performed, e.g., under a reaction chamber pressure of 10 Pa at a temperature ranging from 500 to 700° C. for 5 minutes. Oxygen deficiency in the tantalum pentoxide film can also be cured by this treatment.

As described above, plasma 17 is generated from the oxygen gas in the discharge tube 16 by the plasma discharge induced by the alternating electric fields. Ions, radicals and ozone ($O_3$) are generated from the oxygen gas by the plasma discharge, among which radicals and ozone are used in the treatment. In order to prevent the wafer 4 and the film from being damaged or attacked by the collision of ions, the plasma source 2 is separated from the reaction chamber 1. Oxygen radicals and ozone having higher reactivity than oxygen are extracted from the ICP type remote plasma source 2 onto the heated wafer 4, and carbon included in the interface between the tantalum pentoxide film and the Si wafer is removed, resulting in the leakage current being substantially decreased.

Figure 8:
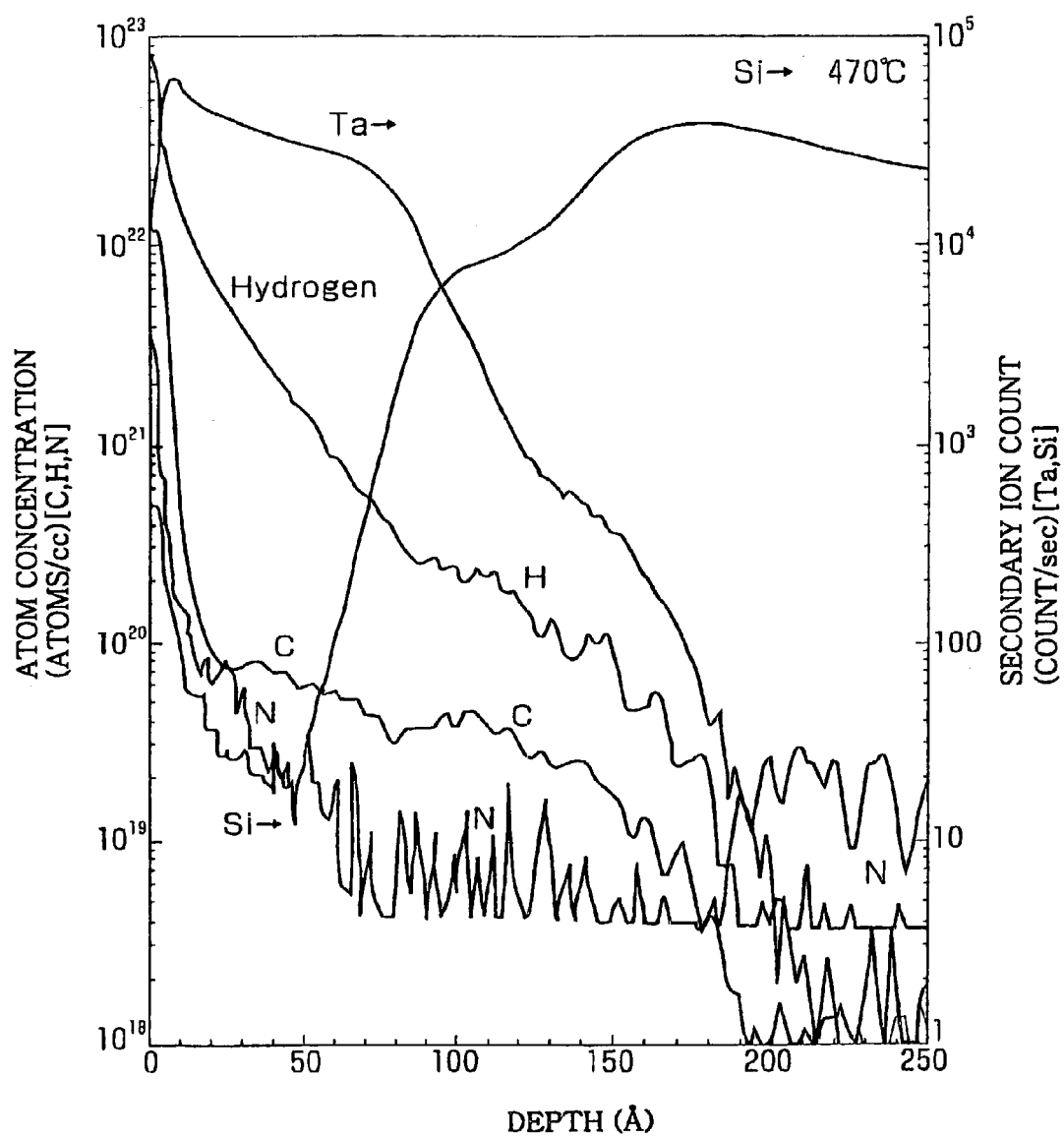
FIG. 8 displays a compositional depth profiles of the elements included in a tantalum pentoxide film treated by oxygen plasma in the apparatus in accordance with the first embodiment of the present invention.

FIG. 8 shows compositional depth profiles of the elements included in an oxygen plasma treated tantalum pentoxide film by the apparatus in accordance with the first embodiment of the present invention ($Ta_2O_5$ deposition temperature: 470° C.). The abscissa of this graph represents depth from the surface of the tantalum pentoxide film; the ordinate at the left, atom concentrations (atoms/cc) of C, H and N; and the ordinate at the right, secondary ion counts (counts/sec) of Ta and Si. The thickness of the tantalum oxide film is 100 Å.

As can be seen from FIG. 8, carbon is preferably removed from the interface.

Further, carbon is removed at the edge portion of the wafer as well as in the center portion thereof to a substantially same degree, i.e., carbon is uniformly removed from the film. Oxygen deficiency of the film can also be cured. Moreover, if the oxygen plasma treatment is performed at a higher temperature than that of the deposition, crystallization of the tantalum pentoxide film and the film quality improvement can be accomplished simultaneously.

Nitriding of a DRAM gate oxide film will now be described hereinafter with reference to FIGS. 5 and 6.

A wafer having an oxide film ($SiO_2$ film) on its surface is loaded into the reaction chamber 1. Thereafter, a nitrogen containing gas such as $N_2$, $NH_3$, $N_2O$ and/or NO is supplied into the reaction chamber 1 through the reactive gas inlet 8C at the end portion of the discharge tube 16 (other reactive gas inlets 8A, 8B are not used). After the pressure of the reaction chamber 1 is stabilized, high frequency power is applied to the coil 19, thereby generating plasma 17 in the discharge tube 16. Active species excited by the plasma 17 are then supplied into the reaction chamber 1 through the active species supply outlet 23 and the nitriding of the surface of the oxide film is carried out. The nitriding treatment may be performed, e.g., with a nitrogen containing gas having a flow rate of 200 to 400 sccm and at a reaction chamber temperature of 750° C. for 5 minutes.

Further, a film deposition process can also be performed on a wafer in the reaction chamber 1 by supplying a reactive gas through one of the reactive gas inlets 8A, 8B shown in FIG. 6 without using remote plasma. During the deposition process, reaction products are also adhered to and accumulated on the inner surfaces of the reaction chamber 1 and the discharge tube 16. Since reaction products can be released and adhered to the wafer 4 during the deposition, thereby deteriorating the production yield, they have to be periodically removed. Removal of the contaminants can be readily accomplished in the apparatus of the present invention by using the plasma of a remote etching gas. That is, the inner surfaces of reaction chamber 1 and the discharge tube 16 can be cleaned effectively without or with little damages by using the active species generated by the remote plasma. The type of reactive gas can vary with the types of reaction products to be removed and can be of a gas containing, e.g., $NF_1$, $C_2F_6$, $CF_4$, $N_2$, $N_2O$, $O_2$ or a mixture thereof. During the chamber cleaning process, the etching gas is supplied through the reactive gas inlet 8C and exhausted through the exhaust port 9A.

Figure 9:
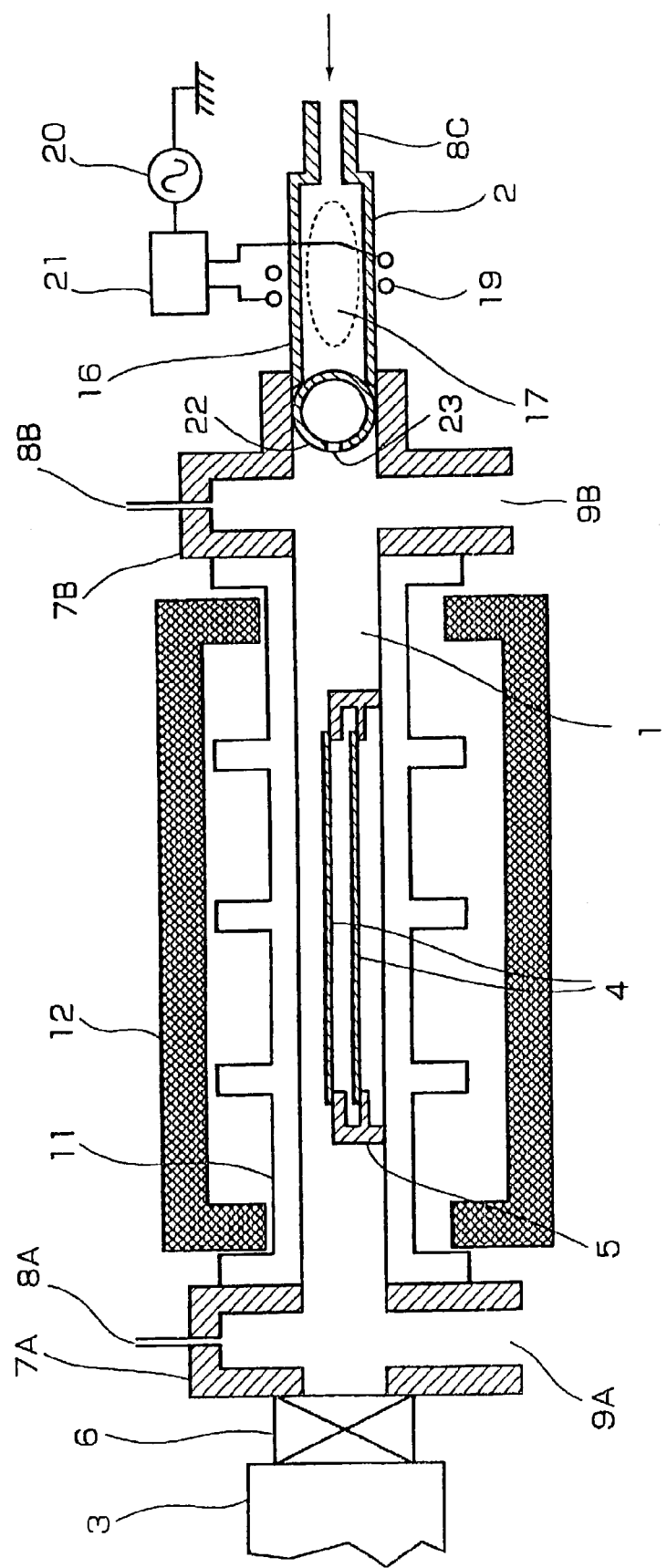
FIG. 9 presents a cross-sectional side view of a reaction chamber and a plasma source of an apparatus in accordance with a second embodiment of the present invention.

FIG. 9 shows a cross-sectional side view of a reaction chamber 1 and a plasma source 2 of a semiconductor manufacturing apparatus in accordance with a second embodiment of the present invention, wherein the structure of a wafer holder 5 differs from that of the first embodiment.

The wafer holder 5 shown in FIG. 9 has two, i.e., upper and lower, racks by which two wafers can be processed simultaneously, while the wafer holder 5 of the reaction chamber 1 of the first embodiment shown in FIGS. 5 and 6 has one rack so that wafers can be processed one at a time. Such configuration is possible due to the fact that the active species generated in the plasma source 2 are extracted into the reaction chamber 1 to flow in a substantially parallel direction to the surfaces of the wafers. By treating two wafers simultaneously, production time and cost can be substantially reduced.

Figure 10:
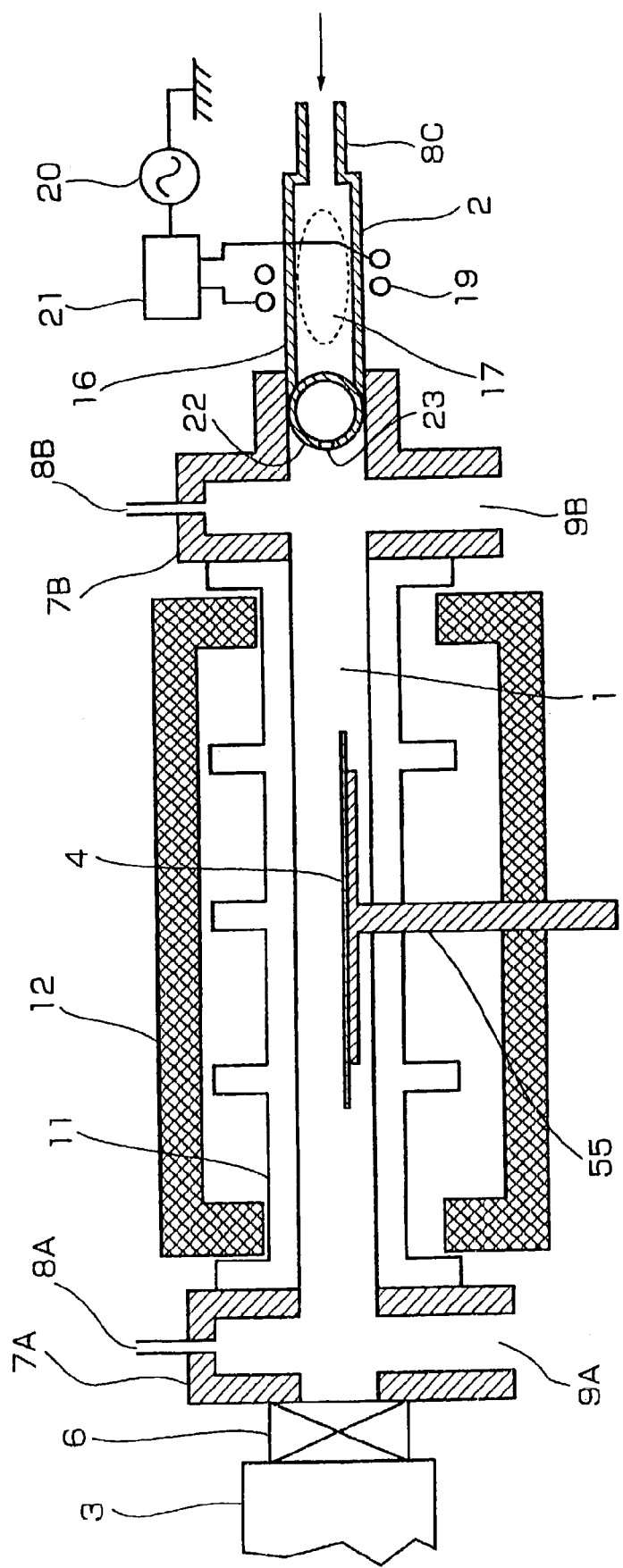
FIG. 10 depicts a cross-sectional side view of a reaction chamber and a plasma source of an apparatus in accordance with a third embodiment of the present invention.

FIG. 10 shows a cross-sectional side view of a reaction chamber 1 and a plasma source 2 of a semiconductor manufacturing apparatus in accordance with a third embodiment of the present invention, which is suitable for uniform treatment of the wafer.

As shown in the drawing, the apparatus has a wafer holder 55 which can be rotated in the reaction chamber 1. Process uniformity can be enhanced by the rotation of the wafer 4 loaded on the rotating wafer holder 55.

Figure 11:
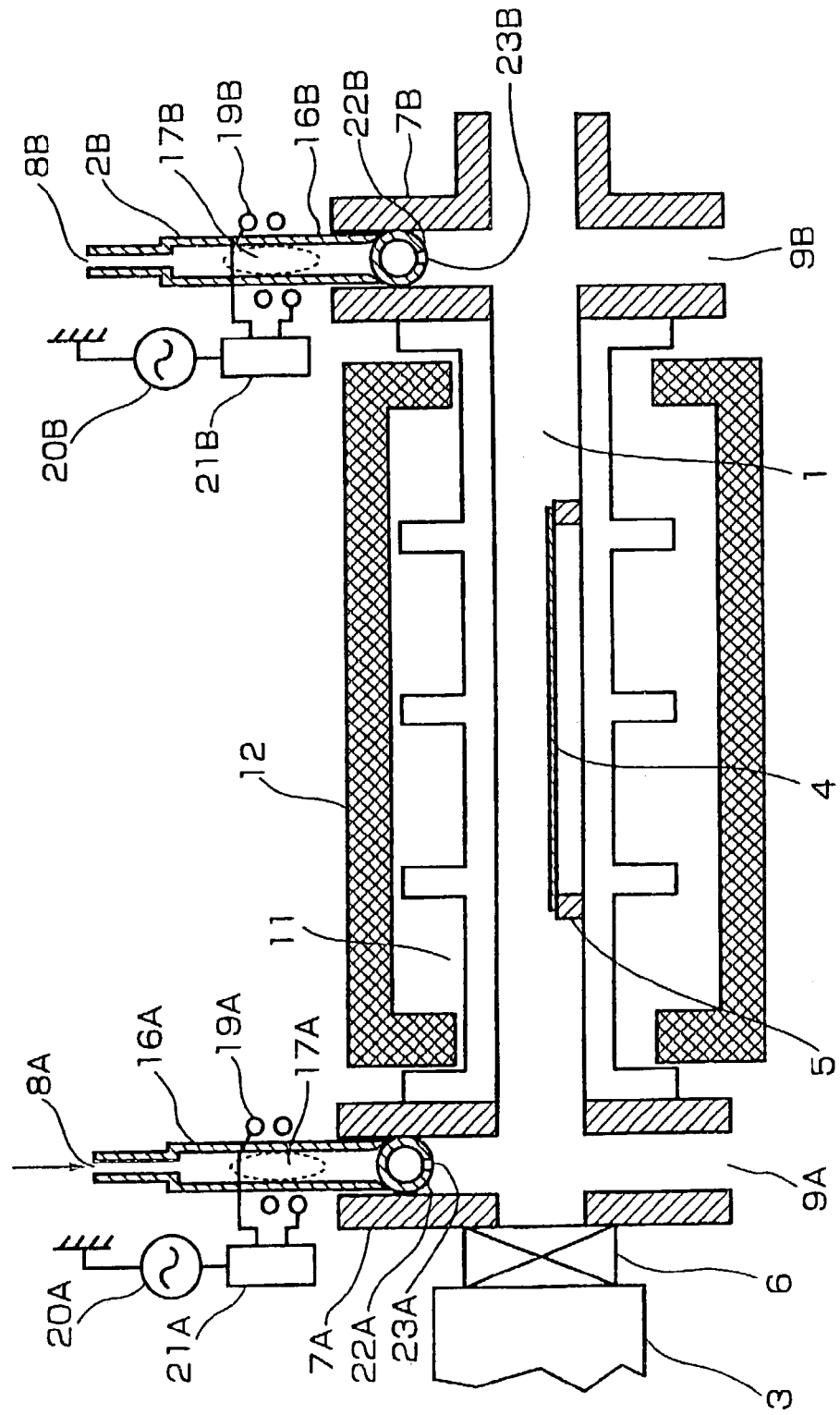
FIG. 11 represents a cross-sectional side view of a reaction chamber and a plasma source of an apparatus in accordance with a fourth embodiment of the present invention.

FIG. 11 provides a cross-sectional side view of a reaction chamber 1 and plasma sources 2A and 2B of a semiconductor manufacturing apparatus in accordance with a fourth embodiment of the present invention, which is also suitable for uniform treatment of the wafer 4.

The apparatus has two plasma sources 2A, 2B, each being identical to that of the first embodiment shown in FIGS. 5 and 6. The plasma sources 2A, 2B are, respectively, arranged at the gas manifolds 7A, 7B. By implementing two plasma sources in such a configuration, it is possible to make active species flow in two opposite directions: one stream from the active species supply outlet 23A to the exhaust port 9B, the other from the supply outlet 23B to the exhaust port 9A. By using this configuration (flip-flop flow), the wafer 4 can be treated uniformly even if it is disposed in a region where the distribution of active species is not stabilized since the biased effect of one active species stream can be counterbalanced by the other.

Figure 12:
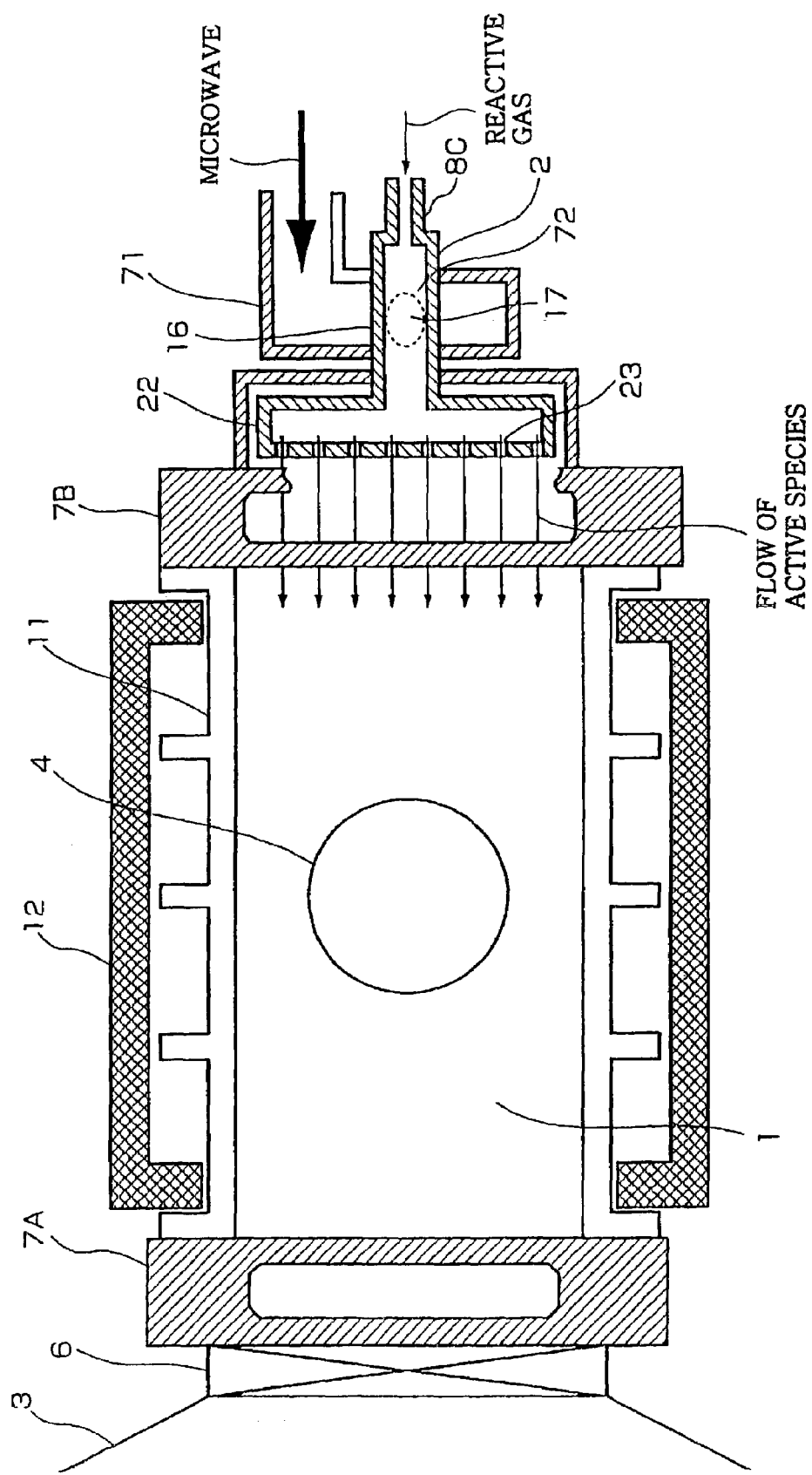
FIG. 12 provides a cross-sectional plan view of a reaction chamber and a plasma source of an apparatus in accordance with a fifth embodiment of the present invention.

FIG. 12 depicts a cross-sectional plan view of a reaction chamber 1 and a plasma source 2 of a semiconductor manufacturing apparatus in accordance with a fifth embodiment of the present invention, in which microwave power is used as a power source.

When microwave is used as a power source, a microwave cavity 72 is formed by a waveguide 71.

Figure 13:
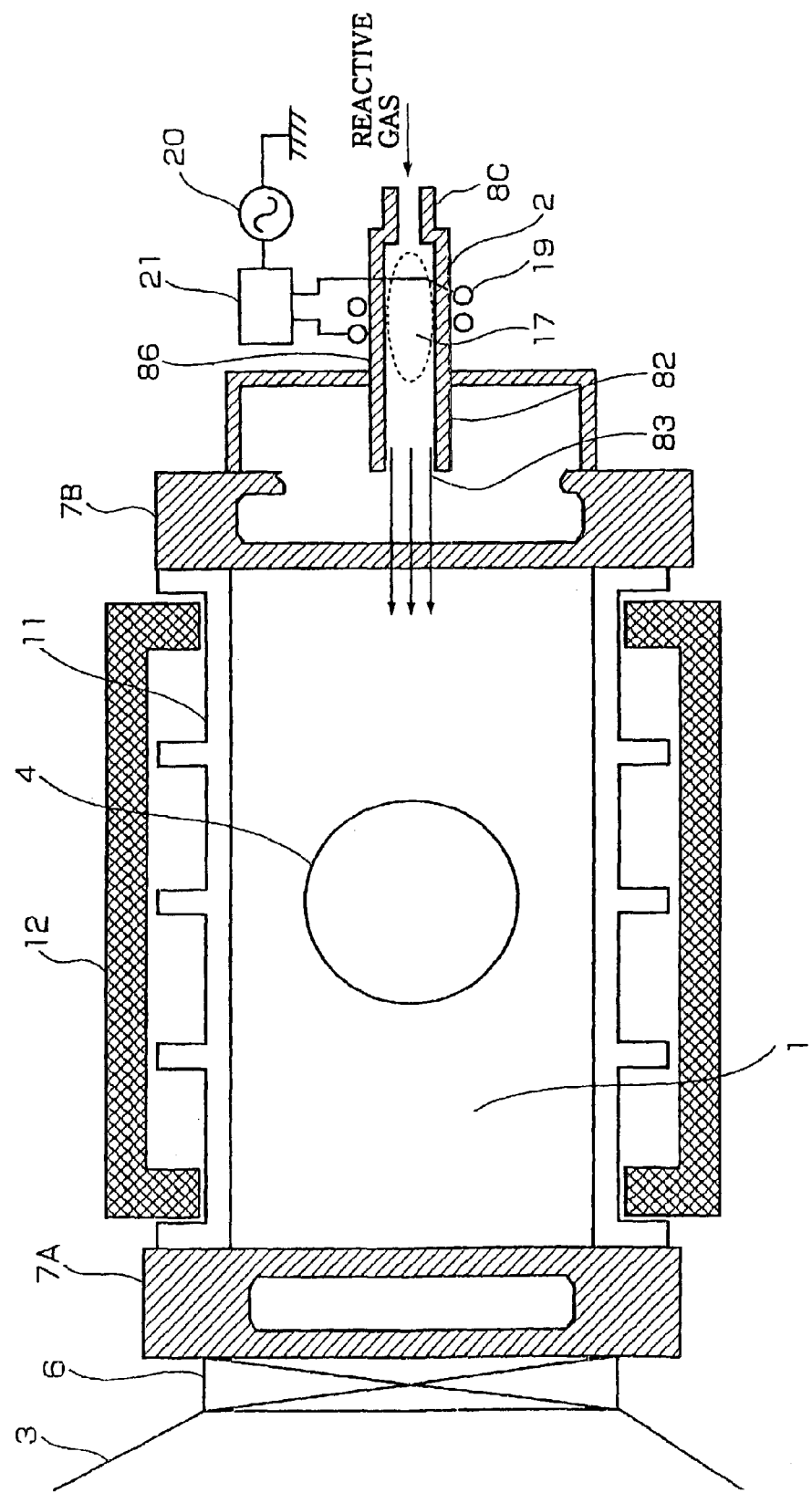
FIG. 13 offers a cross-sectional plan view of a reaction chamber and a plasma source of an apparatus in accordance with a sixth embodiment of the present invention.

FIG. 13 offers a cross-sectional plan view of a reaction chamber 1 and a plasma source 2 of a semiconductor manufacturing apparatus in accordance with a sixth embodiment of the present invention, wherein an active species supply port 82 and an active species supply outlet 83 have different structures from those of the first embodiment shown in FIGS. 5 and 6.

The discharge tube 86 shown in FIG. 13 is not T-shaped as shown in FIG. 5, but straight pipe-shaped. The active species supply outlet 83 can have various shapes such as circle, rectangular or the like.

Figure 14:
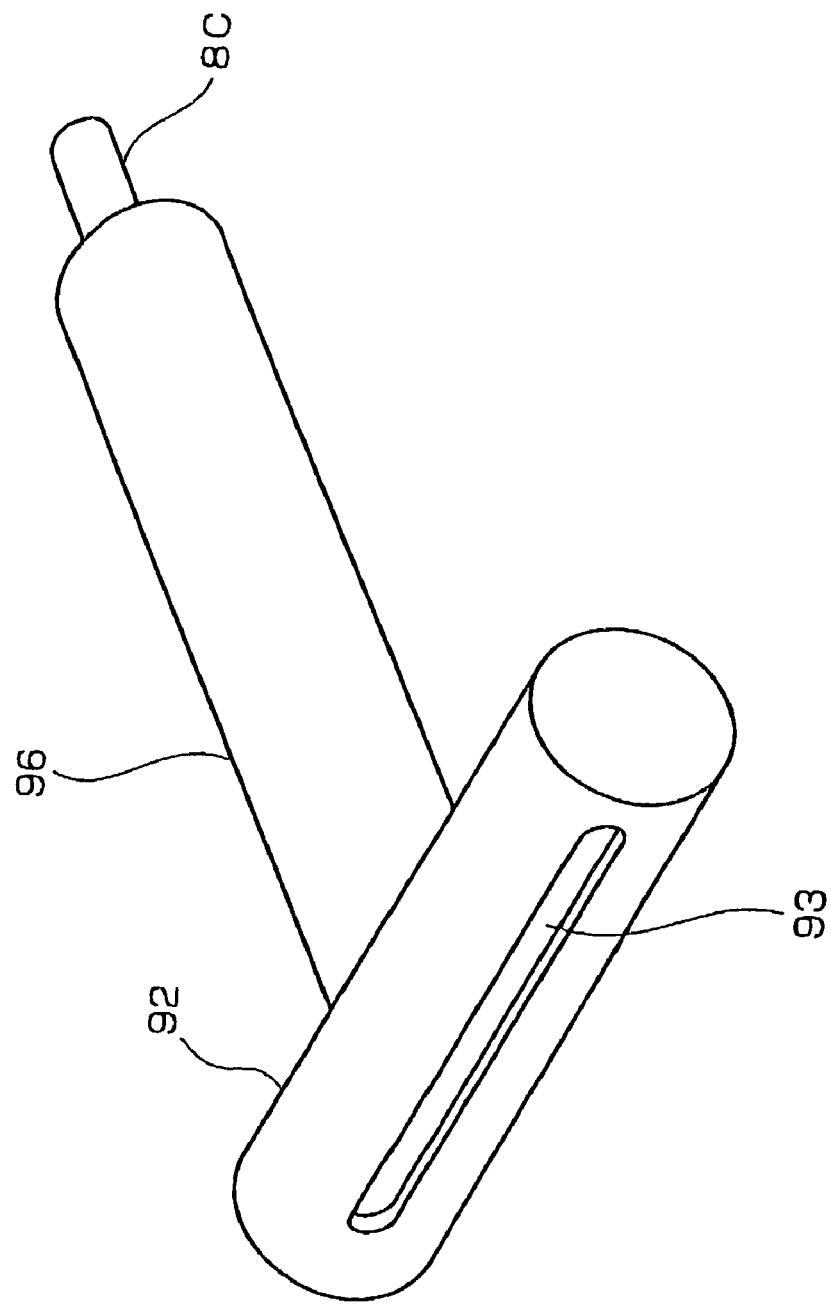
FIG. 14 sets forth a perspective view of an active species supply part and a supply port of a discharge tube in accordance with a seventh embodiment of the present invention.

FIG. 14 describes a perspective view of an active species supply port 92 and a supply outlet 93 of a discharge tube 96 in accordance with a seventh embodiment of the present invention.

As shown in the drawing, the discharge tube 96 may be T-shaped as in the first embodiment but with a slit-shaped supply outlet 93 at the supply port 92 to thereby uniformly supply active species to the wafer 4.

Figure 15:
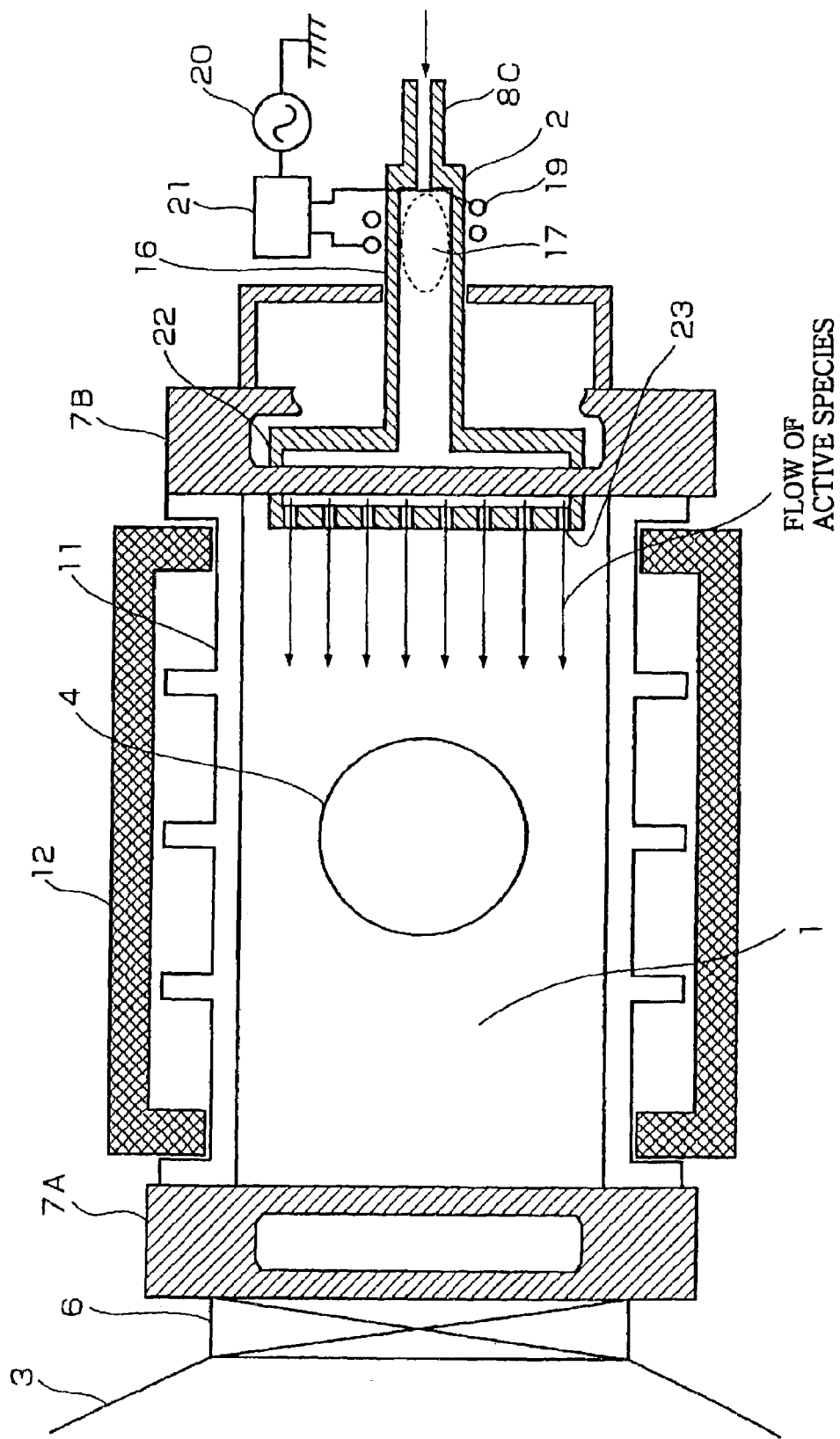
FIG. 15 exemplifies a cross-sectional plan view of a reaction chamber and a plasma source of an apparatus in accordance with an eighth embodiment of the present invention.

FIG. 15 outlines a cross-sectional plan view of a reaction chamber 1 and a plasma source 2 of a semiconductor manufacturing apparatus in accordance with an eighth embodiment of the present invention, in which metal contamination of wafer can be substantially reduced or prevented.

In order to prevent metal contamination of the wafer, it is preferable that any parts capable of releasing metal contaminants be not disposed in a space between the supply outlet 23 and the wafer 4. In case the gas manifold 7B is made of a metal, e.g., stainless steel, the metal contamination of the wafer can be significantly reduced by positioning the active species supply outlet 23 of the discharge tube 16 inside the reaction tube 11 as shown in FIG. 15.

Figure 16:
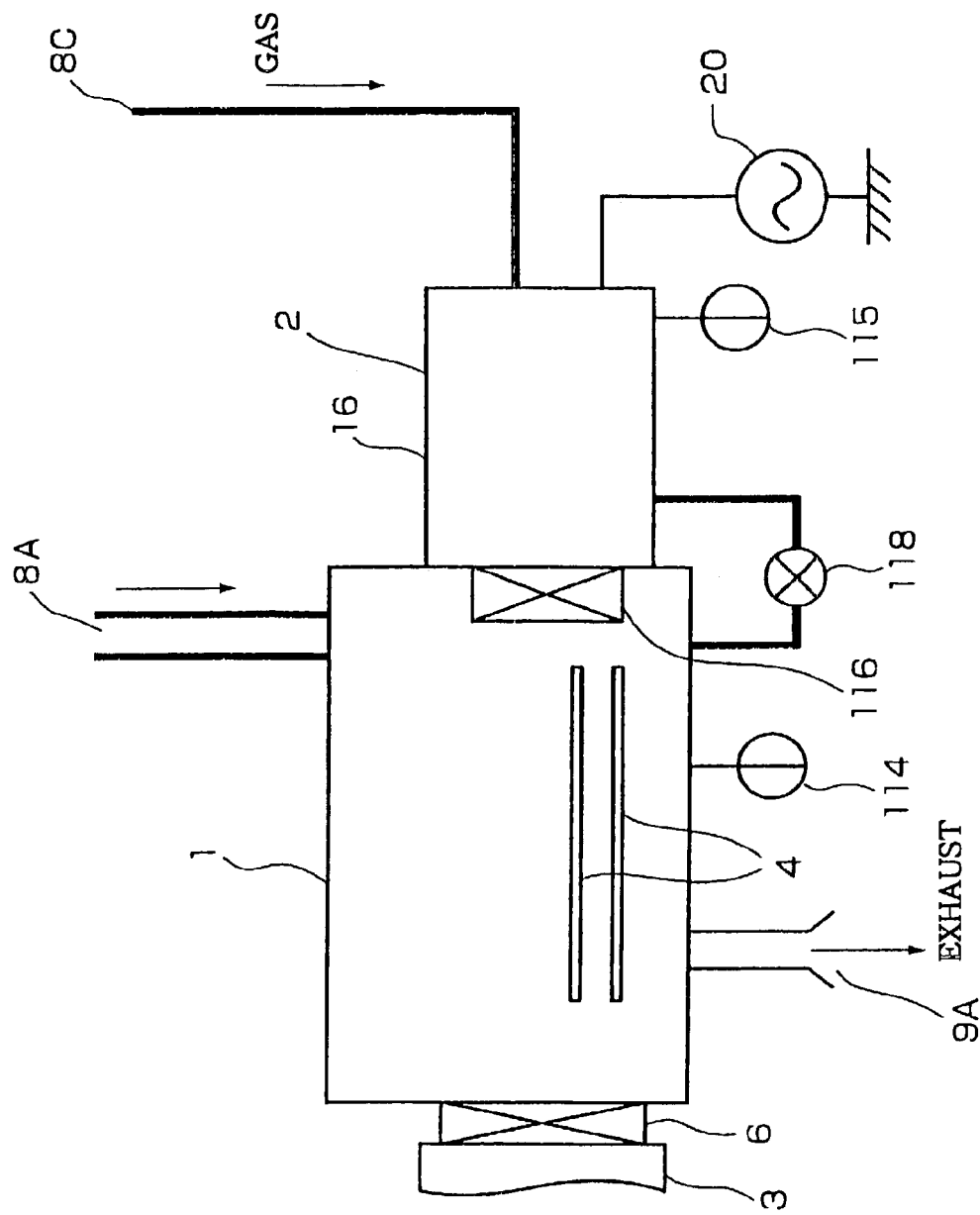
FIG. 16 outlines a cross-sectional side view of a reaction chamber and a plasma source of an apparatus in accordance with a ninth embodiment of the present invention.

FIG. 16 exemplifies a schematic cross-sectional side view of a reaction chamber 1 and a plasma source 2 of a semiconductor manufacturing apparatus in accordance with a ninth embodiment of the present invention.

In the drawing, the reference numeral 1 represents a reaction chamber; 6, a gate valve airtightly separate the reaction chamber 1 from the transfer chamber; 8A, a reactive gas inlet to the reaction chamber 1; 9A, an exhaust port of the reaction chamber 1; 4, wafers; 2, a plasma source of the ICP type; 16, a discharge tube of the plasma source 2; 116, a gate valve between the reaction chamber and the plasma source 2; 8C, a reactive gas inlet to the plasma source 2; 20 RF generator; 114 and 115, pressure gages; and 118, pressure balancing valve.

In the apparatus in accordance with this embodiment, the plasma source 2 is arranged outside of the reaction chamber 1, i.e., it is of a remote plasma type as in the previous embodiments. A gas is supplied to the plasma source 2 and excited therein. Thereafter, active radicals generated in the plasma source 2 are supplied to the reaction chamber 1 and reacted with the wafer 4 to be treated. The reaction chamber 1 is of a hot-wall type as in the previous embodiments, wherein the reaction chamber 1 is heated by a resistive electric heater 11 positioned outside the reaction tube 11. The apparatus has a wafer holder (not shown) receiving two wafers in a vertical direction as shown in FIG. 9.

In accordance with the embodiment shown in FIG. 16, the semiconductor manufacturing apparatus has the reactive gas inlet 8A for deposition process in the reaction chamber 1 which can be separated from the plasma source 2 by the gate valve 16. In the apparatus shown in FIG. 16, the deposition process is performed, while the gate valve 116 is closed, by supplying a reactive gas for deposition into the reaction chamber 1 from the reactive gas inlet 8A; and subsequently plasma treatment can be performed in the same reaction chamber 1, while the gate valve 116 is open. By closing the gate valve 116 during the deposition process, the reactive deposition gas is prevented from entering into the plasma source 2 and forming reaction products inside thereof. If the plasma source 2 is contaminated by the reaction products of the deposition gas, plasma generation can be undesirably affected.

Since the gate valve 116 is opened in the presence of a large pressure difference between the plasma source 2 and the reaction chamber 1, particulates of foreign materials may be introduced from one to the other to cause defects on the wafer 4. In order to prevent this problem, pressure gauges 114, 115 and the pressure balancing valve 118 are provided in the apparatus.

A film deposition process and a post-deposition process are performed in the apparatus as follows:

(a) loading a substrate, e.g., wafer 4, into the reaction chamber 1 from the transfer chamber 3 and closing the gate valve 6;

(b) depositing, e.g., a tantalum pentoxide film on the wafer 4 at a deposition temperature while supplying a deposition gas through the gas inlet 8A;

(c) performing purge process for several minutes after completing the film deposition process in order to remove the remaining gas in the reaction chamber 1;

(d) balancing or equalizing the pressures of the plasma source 2 and the reaction chamber 1 via the pressure balancing valve 118 and then opening the gate valve 116 between the reaction chamber 1 and the plasma source 2;

(e) performing the post-deposition process by supplying a reaction gas, e.g., $O_2$, $O_3$, $N_2O$ or NO gas containing oxygen for removing carbon from the deposited tantalum pentoxide film, into the discharge tube 16 via the gas inlet 8C, exciting the gas to generate plasma, and removing carbon from the tantalum pentoxide film and curing the oxygen deficiency therein with the active radicals extracted from the plasma source 2 into the reaction chamber 1;

(f) terminating the gas supply into the plasma source 2 and closing the gate valve 116 between the plasma source 2 and the reaction chamber 1;

(g) purging the reaction chamber 1 for several minutes again in order to remove the remaining gas therein and lowering the temperature of the wafer 4; and, (h) opening the gate valve 6 and unloading the processed wafer 4 into the transfer chamber 3.

Further, if a single post-deposition treatment cannot sufficiently reduce carbon concentrations inside the film and the interface region between the wafer and the film below a desired level, e.g., if a penetration depth of a single carbon removing process is less than the film thickness, carbon removal can be effectively accomplished by repeating the deposition and post-deposition processes a multiple number of times. In that case, steps (b)–(g) are repeated a multiple number of times while controlling the thickness of the film formed by one deposition process of step (b) to be less than the penetration depth of one post-deposition process of step (e).

A pre-deposition process can be also carried out between steps (a) and (b), if necessary, in the same reaction chamber 1. In that case, the pre-deposition process can be performed as follows:

(a-1) balancing the pressures of the plasma source 2 and the reaction chamber 1 and opening the gate valve 116 in a similar manner as in step (d);

(a-2) performing the pre-deposition process by supplying, e.g., a nitriding gas such as $N_2$, $NH_3$, $N_2O$ or NO gas containing nitrogen, into the discharging tube 16 via the gas inlet 8C, generating plasma of the nitriding gas, and nitriding the surface of the wafer 4 with the active species generated by the plasma source 2;

(a-3) terminating the gas supply into the plasma source 2 and closing the gate valve 116; and, (a-4) purging the reaction chamber 1, if necessary, to remove the remaining gas therein.

The nitriding pre-deposition process is carried out in order to prevent the formation of a silicon oxide layer between the tantalum pentoxide film and its base layer, when the base layer is Si (especially polycrystalline silicon). For silicon can react with oxygen contained in the tantalum pentoxide forming gas or the tantalum pentoxide film to form silicon oxide.

By providing the gate valve 116, the plasma source 2 can be isolated from the reaction chamber 1 during the deposition process and, therefore, the plasma source 2 is prevented from being contaminated by the reaction products of the deposition gas, which can adversely affect the plasma generation. Further, the pre-deposition, deposition and post-deposition processes can be performed in a same chamber without having to employ a multiple number of apparatus, to thereby reduce process time and improve productivity. Also, the deposition and the post-deposition processes can be performed a multiple number of times in the same chamber without conveying the wafer between different process chambers, rendering the film quality more uniform. It is to be understood that the semiconductor manufacturing apparatus of the present invention is applicable to various fabrication processes, including but not limited to a deposition process for forming a $Ta_2O_5$ film or post-deposition process therefor using an oxygen based gas.

Figure 17:
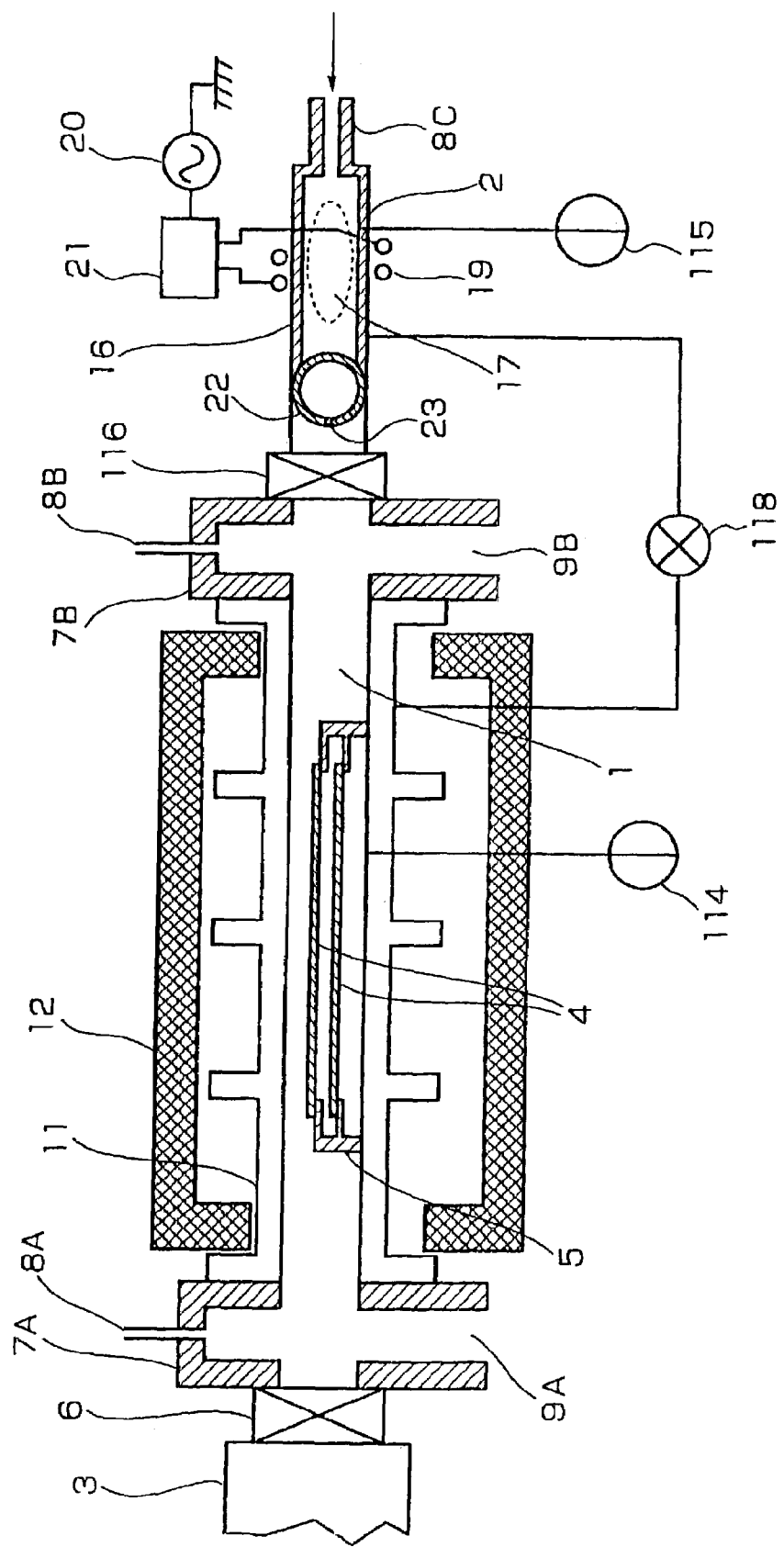
FIG. 17 discloses a cross-sectional side view of a reaction chamber and a plasma source of an apparatus in accordance with a tenth embodiment of the present invention.

FIG. 17 highlights a cross-sectional side view of a reaction chamber 1 and a plasma source 2 of a semiconductor manufacturing apparatus in accordance with a tenth embodiment of the present invention.

The apparatus is identical to that shown in FIG. 9 excepting that it further includes a gate valve 116, pressure gages 114, 115 and a pressure balancing valve 118 as shown in FIG. 16. The manner of operation, function and effects of the apparatus are the same as in the ninth embodiment described with reference to FIG. 11.

Although the invention has been shown and described with respect to the preferred embodiments, it will be understood by those skilled in the art that various changes and modifications may be made without departing from the spirit and scope of the invention as defined in the following claims.

What is claimed is:

1. A method for use in manufacturing a semiconductor device, comprising the steps of:

generating a plasma in each of at least one plasma source arranged outside a reaction chamber, the reaction chamber having therein at least two substrates to be simultaneously processed; and supplying active species included in the plasma into the reaction chamber through a supply port arranged at a side of the reaction chamber and flowing the active species from the supply port to an exhaust port arranged at a substantially opposite side to the supply port to perform a predetermined process on the substrates, the actives species flowing across the substrates in one direction substantially parallel to surfaces of the substrates.

2. The method of claim 1, wherein the number of said at least one plasma source is at least two, directions of the active species supplied from the plasma sources are different from each other and the substrates are processed by alternately using the active species from at least two plasma sources a predetermined number of times.

3. The method of claim 1, wherein each substrate has thereon a tantalum oxide film and the process is performed by using active species containing oxygen species for improving film quality of the tantalum oxide film.

4. The method of claim 3, wherein the process is performed at a higher temperature than deposition temperature of the tantalum oxide film to thereby cause crystallization of the tantalum oxide film to occur during the process.

5. The method of claim 1, wherein each substrate has an oxide film on top thereof and the process is performed by using active species containing nitrogen species for nitriding the surface of the oxide film.

6. The method of claim 1, wherein the substrates are spaced apart from the plasma source at a distance where the concentration of the active species on surfaces of the substrates becomes substantially constant.

7. A method for use in manufacturing a semiconductor device, comprising the steps of:
(b1) generating a plasma in at least one plasma source arranged outside a reaction chamber, the reaction chamber having therein at least two substrates to be simultaneously processed;
(b2) supplying active species included in the plasma into the reaction chamber in a direction substantially parallel to surfaces of the substrates to perform a predetermined process thereon; and
(a) simultaneously forming a film on each of said at least two substrates by a thermal CVD method in the reaction chamber before performing the step (b1).

8. The method of claim 7, the method further comprising a step of subjecting each substrate to the steps (a), (b1) and (b2) a predetermined number of times in order to obtain a desired film thickness.

9. The method of claim 7, wherein the film forming step (a) is a tantalum oxide film forming step by using tantalum pentaethoxide and the plasma treatment performing steps (b1) and (b2) are performed by supplying to the substrate an active gas containing oxygen species.

10. A method for use in manufacturing a semiconductor device, comprising the steps of:
(a) generating a plasma in at least one plasma source arranged outside a reaction chamber, the reaction chamber having therein at least one substrate to be processed; and
(b) supplying and removing active species generated by the plasma source into and from the reaction chamber through a supply port arranged at a side of the reaction chamber and an exhaust port arranged at a substantially opposite side to the supply port, the supply port and the exhaust port being positioned substantially at a same level, and the active species flowing in a substantially horizontal direction from the supply port to the exhaust port.

11. The method of claim 10, wherein said at least one substrate is spaced apart from said at least one plasma source at a distance where the concentration of the active species on surface of said at least one substrate becomes substantially constant.

12. The method of claim 10, wherein the number of said at least one substrate processed in the reaction chamber at a time is at least two.

13. The method of claim 10, wherein the number of said at least one plasma source is at least two, directions of the active species supplied from the plasma sources are different from each other and said at least one substrate is processed by alternately using the active species from at least two plasma sources a predetermined number of times.

14. The method of claim 10, wherein said at least one substrate has thereon a tantalum oxide film and the process is performed by using active species containing oxygen species for improving film quality of the tantalum oxide film.

15. The method of claim 14, wherein the process is performed at a higher temperature than deposition temperature of the tantalum oxide film to thereby cause crystallization of the tantalum oxide film to occur during the process.

16. The method of claim 13, further comprising the step of:
(c) forming a film on said at least one substrate by a thermal CVD method in the reaction chamber before performing the step (a).

17. The method of claim 16, the method further comprising a step of subjecting said at least one substrate to the steps (a), (b) and (c) a predetermined number of times in order to obtain a desired film thickness.

18. The method of claim 16, wherein the film forming step (c) is a tantalum oxide film forming step by using tantalum pentaethoxide and the plasma treatment performing steps (a) and (b) are performed by supplying to said at least one substrate an active gas containing oxygen species.

* * * * *